(12) United States Patent
Yoshida

(10) Patent No.: US 8,444,798 B2
(45) Date of Patent: May 21, 2013

(54) HOT PRESS CUSHIONING MEMBER AND METHOD FOR MANUFACTURING LAMINATED PLATE

(75) Inventor: Akira Yoshida, Kanuma (JP)

(73) Assignee: Yamauchi Corporation, Osaka (JP)

( * ) Notice: Subject to any disclaimer, the term of this patent is extended or adjusted under 35 U.S.C. 154(b) by 433 days.

(21) Appl. No.: 12/745,968

(22) PCT Filed: Dec. 1, 2008

(86) PCT No.: PCT/JP2008/071793
§ 371 (c)(1),
(2), (4) Date: Jun. 3, 2010

(87) PCT Pub. No.: WO2009/072463
PCT Pub. Date: Jun. 11, 2009

(65) Prior Publication Data
US 2010/0251908 A1     Oct. 7, 2010

(30) Foreign Application Priority Data
Dec. 7, 2007 (JP) .................................. 2007-317351

(51) Int. Cl.
*B32B 37/00*    (2006.01)

(52) U.S. Cl.
USPC .................. 156/228; 156/581; 156/583.3

(58) Field of Classification Search
USPC .............. 156/228, 580, 583.1, 583.3; 100/38, 100/295; 139/420 R, 421; 442/104, 181, 442/182, 183
See application file for complete search history.

(56) References Cited

U.S. PATENT DOCUMENTS

| | | | |
|---|---|---|---|
| 5,120,597 A * | 6/1992 | Takimoto et al. | 442/136 |
| 5,298,322 A * | 3/1994 | Hennecken et al. | 442/229 |
| 6,040,253 A * | 3/2000 | Hennecken | 442/239 |
| 6,413,889 B1 * | 7/2002 | Best et al. | 442/305 |
| 6,780,280 B2 * | 8/2004 | Halterbeck et al. | 156/583.3 |
| 2008/0227354 A1 | 9/2008 | Yoshida et al. | |

FOREIGN PATENT DOCUMENTS

| CN | 1942298 A | 4/2007 |
|---|---|---|
| EP | 1 839 833 A1 | 10/2007 |
| JP | 6-126855 A | 5/1994 |
| JP | 9-29773 A | 2/1997 |
| JP | 2004-243728 A | 9/2004 |
| JP | 2004-330718 A | 11/2004 |
| JP | 2006-026673 A | 2/2006 |
| JP | 2006-192786 A | 7/2006 |

(Continued)

OTHER PUBLICATIONS

Extended European Search Report for European Application No. 08 85 6956 dated Apr. 18, 2012, pp. 1-6.

(Continued)

*Primary Examiner* — James Sells
(74) *Attorney, Agent, or Firm* — Ditthavong Mori & Steiner, P.C.

(57) ABSTRACT

A hot-press cushioning member 11a is configured so that an amount of compressed thickness deformation (a) is obtained by subtracting a compressed thickness (H2) of the hot-press cushioning member under a predetermined press-forming pressure from an initial thickness (H1), an amount of restored thickness deformation (b) is obtained by subtracting the compressed thickness (H2) from an uncompressed thickness (H3) of the hot-press cushioning member with the press-forming pressure released, and the (a:b) ratio ranges from 1:1 to 1:0.8.

3 Claims, 9 Drawing Sheets

| FOREIGN PATENT DOCUMENTS | | |
|---|---|---|
| JP | 2007-38541 A | 2/2007 |
| JP | 2007-90796 A | 4/2007 |
| KR | 20060126601 A | 12/2006 |
| TW | I1318924 B | 10/2007 |
| WO | WO 2006/075573 A1 | 7/2006 |

OTHER PUBLICATIONS

International Search Report, PCT/JP2008/071793, Feb. 17, 2009, pp. 31-34.

* cited by examiner

HOT PRESS CUSHIONING MEMBER AND METHOD FOR MANUFACTURING LAMINATED PLATE

TECHNICAL FIELD

This invention relates to a hot-press cushioning member and a method for manufacturing laminated plate, and more particularly, to, in processes of manufacturing printed circuit boards, such as copper-clad laminated plates, flexible printed circuit boards, rigid-flex boards, multilayered boards and multilayered flexible printed circuit boards, insulating plates, credit cards, IC cards, liquid crystal display panels, precision apparatus parts including ceramic laminated plates, and melamine decorative plates (hereinafter, they are all referred to as a "laminated plate" in the present invention), a method used in a press forming process and thermal compression bonding process for manufacturing the target products and a hot-press cushioning member for used in the processes.

BACKGROUND ART

Manufacture of a laminated plate begins with stacking a laminated plate material to prepare an object that will be compressed. After being delivered between hot platens, the object is applied with heat and pressure to fluidize and cure thermoplastic resin or thermosetting resin contained in the laminated plate material to make the material into one piece.

If the hot platens and the delivered object have uneven thickness, thermal strains, temperature nonuniformity and so on in the hot pressing process, uniform temperature and pressure cannot be applied to the object, which will later become a product. As a result, the final product may have defects such as thickness defects, cracks and warpage. A preventive measure against such thickness defects of the final product is the use of a cushioning member during press forming. The materials used for the cushioning member include paper, such as kraft paper and linter pulp paper, woven fabric, needle-punch non-woven fabric, rubber, laminated plates of woven fabric or non-woven fabric and rubber, and so on.

In recent years, laminated plates including printed circuit boards tend to have more precise circuits, a greater number of layers and higher heat resistance. Therefore, the laminated plates are required to have an exact thickness. In terms of manufacture of the laminated plates, the use of such high-heat-resistance materials induces the press-forming temperature to be increased more and more. In addition, for the purpose of improving production efficiency, formed products tend to increase in size, and temperature cycle between heating and cooling tends to be accelerated. In such circumstances, the above-described conventional cushioning members are inadequate to deal with the following problems.

The first problem is degradation of thickness accuracy in a plane of the laminated plate. The degradation of thickness accuracy means that the final product has a thickness gradually decreasing from its center toward its end and results in appearing like a convex lens. Especially, around the thinner end part, product deficiency, like thin spots, is developed. The degradation is caused by outward flow of resin in the end part of the laminated plate material, which makes the end part thinner.

The next problem is defects in multi-layered laminated plates (MLB) or other laminated plates provided with inner-layer circuits. The MLB (multi-layered laminated boards) has areas, where the inner-layer circuits are not formed, which are recessed. The recessed areas are likely to develop defects such as voids and thin spots and creases of copper films.

The other problem is residual strains and warpage in products caused by the curing contraction and thermal contraction of resin occurring during manufacture of the laminated plate. Especially, in the case of a laminated plate made of a thermosetting resin, the residual strains in the laminated plate are likely to cause cracks, so-called measling, in the printed circuit board during a manufacturing process such as a drilling and punching process.

In order to handle these problems, Japanese Unexamined Patent Application Publication No. 6-126855 discloses a cushioning member with a film that fluidizes during hot pressing to improve the thickness accuracy of laminated plates and prevent measling from occurring. Japanese Unexamined Patent Application Publication No. 9.29773 uses rubber as a cushioning member to prevent the measling from occurring; the rubber exhibits a specific storage elastic modulus.

However, the conventional cushioning members are inadequate to meet the recent performance demand.

DISCLOSURE OF INVENTION

The present invention has an object to provide a hot-press cushioning member enabling manufacture of laminated plates that has an accurately-controlled thickness, less residual strain and warpage, and excellent product quality even in areas in which inner-layer circuits are not formed.

The present invention has another object to provide a method for manufacturing a laminated plate that has an accurately-controlled thickness, less residual strain and warpage, and excellent product quality even in areas in which inner-layer circuits are not formed.

The inventor of the present invention conducted causal analyses to solve the above-described problems involved with the conventional cushioning members.

It can be considered that the first problem in which thickness accuracy in the plane of the laminated plate is degraded is caused by the following factors.

FIG. 16 is a diagram of an object 101 to be compressed during the hot pressing procedure and a conventional cushioning member 102 made of kraft paper or the like. Referring to FIG. 16, the object 101 is uniformly pressurized with the cushioning member 102 (FIG. 16(A)). When the resin starts fluidizing (FIG. 16(B)), the resin at the end part 103 of the object 101 flows outward, i.e., in the directions indicated by outlined rightward and leftward arrows in FIG. 16B, and the end part 103 of the object 101 becomes thinner. With further fluidization of the resin (FIG. 16(C)), the cushioning member 102 cannot apply enough pressure, which is indicated by outlined vertical arrows, to the thin end part 103, which causes the resin to flow outward more. In this way, the in-plane thickness accuracy is degraded.

More specifically speaking, the conventional cushioning member 102 under pressure exerts sufficient cushioning ability, but does not have enough resilience at the area near the part thinned by the fluidization of the resin, and therefore the pressure applied to the end part 103 of the object 101 is decreased. Because the end part 103 is applied with less pressure, the resin positioned slightly inside the end part 103 flows toward the end part. Furthermore, the resin in the center part 104 flows from inner part toward the end part 103. Consequently, the object 101 has a thickness distribution similar to a convex lens, i.e., the end part 103 is the thinnest and becomes thicker toward the center part 104. Under the influence of the transfer of the product shape, the pressure drop at the end part 103 and the pressure rise at the center part 104, the cushioning member 102 is deformed into a concave shape.

Repeated use of the cushioning member will cause further degradation of the thickness accuracy of the products.

The next problem regarding voids, thin spots and creases of copper films in recessed areas, where inner-layer circuits are not formed, of a laminated plate is possibly caused by the following factors.

With application of pressure by a press, the recessed areas where the inner-layer circuits are not formed are also pressurized. Fluidization of the resin makes the recessed areas thinner; however, the conventional cushioning members have only a small force to push back the areas and therefore can apply less pressure. Because the pressure applied to the recessed areas is low, voids and thin spots develop. In addition, the excess resin flowing from around the recessed areas deforms the copper film or other film laminated on a surface in the form of creases or the like.

The last problem regarding residual strains and warpage of products is possibly caused by the following factors.

As described above, the end part of the product becomes thinner during press forming due to fluidization of resin and is less prone to being pressurized by the conventional cushioning member. At this point, in the case of thermosetting resin, it contracts while being cured and uneven pressure causes uneven contraction in a plane, resulting in residual strains. In addition, the object suffers from thermal contraction while being cooled. If the object is unevenly pressurized, the object shrinks differently by area, resulting in warpage and strains in the final product. Especially, in a case of a large-sized formed product, all of the hot platen and delivered object suffer from thermal contraction during a cooling process; however, the hot platen having temperature nonuniformity does not shrink uniformly and therefore will have differences in thickness. A conventional cushioning member cannot restore itself to make up the thickness differences and therefore unevenly applies pressure, which causes distortion in the laminated plate.

The hot-press cushioning member according to the present invention is used between an object to be compressed and a hot platen when the object, which is a stack of a plurality of laminated plate materials, is subjected to press forming by the application of heat and pressure to manufacture a laminated plate, wherein an amount of compressed thickness deformation (a: hereinafter referred to as "amount of compressed cushion") is obtained by subtracting a compressed thickness (H2) of the hot-press cushioning member under a predetermined press-forming pressure from an initial thickness (H1), an amount of restored thickness deformation (b: hereinafter referred to as "amount of restored cushion") is obtained by subtracting the compressed thickness (H2) from an uncompressed thickness (H3) of the hot-press cushioning member with the press-forming pressure released, and the ratio of the amount of compressed cushion and the amount of restored cushion (a:b) ranges from 1:1 to 1:0.8.

According to the hot-press cushioning member whose ratio of the amount of compressed cushion and amount of restored cushion is set within the above-described range, the object can be uniformly applied with pressure in manufacturing processes of the laminated plate. In addition, even if the object is partially thinned due to fluidization of the resin or even if the thickness of each of the hot platen and delivered object changes due to curing contraction of the resin and thermal contraction of the hot platen and delivered object, the cushioning member resiliently deforms itself so as to fit the changed thickness, thereby uniformly pressurizing across the entire face of the laminated plate. Thus, it is possible to manufacture laminated plates having accurately controlled in-plane thickness and less residual strain and warpage and having excellent product quality even in areas where inner-layer circuits are not formed.

Since the hot-press cushioning member can prevent the product from changing into a convex-lens-like shape and the product can remain flat, unlike the conventional hot-press cushioning members, the hot-press cushioning member does not deform itself into a concave shape with age and maintains its flat shape. Thus, the life cycle of the cushioning member can be extended.

The required amount of compressed cushion for the hot-press cushioning member depends on the precision of the press, products to be formed, thickness accuracy of the delivered object; however, general cushioning members are required to have 50 μm/MPa or more. Alternatively, cushioning members for MLBs or the like, which have very rugged circuits, need a greater amount of compressed cushion.

Preferably, the hot-press cushioning member includes a fiber-rubber composite material layer made of a web and rubber impregnated in the web in the manner in which interstices are formed in the fiber-rubber composite material layer.

According to the hot-press cushioning member having such a fiber-rubber composite material layer, the rubber impregnated in the web enters the interstices in the web to an appropriate degree, but does not completely fill up the interstices and maintains the properties of the interstices, thereby demonstrating excellent cushioning ability. In addition, the rubber coating the fiber can prevent the fiber from being damaged and enhance the restoration of the interstices by means of its elasticity.

An example of a preferred web used in the fiber-rubber composite material layer is woven fabric made of a texturized yarn. The texturized yarn is glass yarn drafted with its short fibers being not parallel with each other and intertwined with each other and tangled, and has a relatively large occupied area. In other words, the texturized yarn is fluffy like wool, and therefore the woven fabric made of the texturized yarn contains a lot of interstices unlike general woven fabric.

According to the hot-press cushioning member including the fiber-rubber composite material layer in which the woven fabric made of the texturized yarn is impregnated with rubber, the rubber impregnated in the woven fabric enters the interstices in the texturized yarn and interstices between the texturized yarns to an appropriate degree, but does not completely fill up the interstices and maintains the properties of the interstices, thereby demonstrating excellent cushioning ability. In addition, the woven fabric made by weaving the texturized yarn can be thinner than non-woven fabric and excellent for thermal conductivity.

Since the glass fiber has heat resistance, which prevents the fiber from significant dimensional change caused by heat, even the hot-press cushioning member repeatedly used in more than one hot-pressing process can ensure excellent dimensional stability. The rubber impregnated in the woven fabric protects the glass fiber, as well as bonds the contact points of the fibers. Therefore, repeated use of the hot-press cushioning member including such a fiber-rubber composite material layer in more than one hot-pressing process does not cause glass fiber damage, which proves the cushioning member's excellent durability. Since the contact points of the fibers are bonded by the rubber, a disadvantage, so-called "wear-out", of woven fabric can be prevented with the aid of elasticity of the rubber, and even if the hot-press cushioning member is repeatedly used in more than one hot-pressing process, it can maintain the properties of the interstices and ensure excellent cushioning ability.

The "texturized yarn" used in this description may be a bulked yarn, a staple yarn, a sliver yarn or the like. The bulked yarn is a yarn processed by an air jet or the like so as to have a greater volume. The staple yarn is made by spinning a glass short-fiber wad into a thread. The sliver yarn is made by twisting untwisted voluminous short fibers (sliver).

The volume ratio of the rubber to the fiber making up the woven fabric in the fiber-rubber composite material layer preferably ranges from 5% to 50%. When the volume ratio of the rubber to the fiber contained in the woven fabric falls within the range, the rubber impregnated in the woven fabric enters the interstices in the texturized yarn and interstices between the texturized yarns to an appropriate degree, but does not completely fill up the interstices so as to maintain a certain degree of the properties of the interstices. If the volume ratio of the rubber is less than 5%, repeated use of the cushioning member in more than one hot-pressing process may cause creep that brings about a decrease in the cushioning ability and also may cause glass fiber damage that leads to impairment of durability. On the other hand, if the volume ratio of the rubber to the fiber contained in the woven fabric is greater than 50%, an excess amount of rubber enters the interstices in the texturized yarn, which reduces the ratio of the interstices, and therefore the cushioning ability of the cushioning member is possibly reduced. A more preferable volume ratio of rubber to fiber in the woven fabric is from 5% to 35%.

In order for the hot-press cushioning member to maintain excellent cushioning ability, the ratio of the interstices in the fiber-rubber composite material layer is set preferably within a range from 20% to 65%. A more preferable ratio of the interstices ranges from 25% to 65%.

Another preferable application of the web used in the fiber-rubber composite material layer is, for example, paper. The hot-press cushioning member including a rubber-impregnated-paper type fiber-rubber composite material layer is a composition of paper and rubber impregnated in the paper, in which the surfaces of the fibers making up the paper are coated with the rubber and an appropriate amount of the rubber is present in interstices in the fibers. Such a hot-press cushioning member has a certain degree of strength as a Fiber Reinforced Rubber (FRR). The presence of the interstices imparts excellent cushioning ability to the cushioning member when it is pressed. In addition, the cushioning member having a composite structure with fiber and rubber can prevent fiber damage with the aid of the rubber and can restore the interstices after the cushioning member is pressed, thereby enabling repeated use of the cushioning member in more than one hot-pressing process. Furthermore, since the base material is paper, the fibers are oriented along the paper plane and the thickness per sheet can be reduced, and therefore the cushioning member can obtain the in-plane uniformity and thermal conductivity equal to those of the conventionally used cushioning members made of paper such as kraft paper.

In the case of using paper for a web, the volume ratio of rubber to fiber in the paper is preferably set to from 10% to 60%. The ratio of the interstices in the fiber-rubber composite material layer is preferably set to from 60% to 90%.

Preferable fibrous materials contained in the paper may be glass, rock wool, carbon, ceramic, metal, polybenzazole, polyimide, aromatic polyamide, polyamide or the like.

Yet another preferable application of the web used in the fiber-rubber composite material layer is, for example, non-woven fabric. In a case where the hot-press cushioning member includes a fiber-rubber composite material layer made by impregnating non-woven fabric with rubber, the rubber impregnated in the non-woven fabric enters interstices in the non-woven fabric to an appropriate degree so as not to completely fill up the interstices, thereby maintaining a certain degree of the properties of the interstices and therefore realizing excellent cushioning ability and restoration of thickness.

For rubber used to impregnate the web, the preferable rubber is a kind of rubber or a compound containing two or more kinds of rubber selected from the group consisting of fluoro-rubber, EPM, EPDM, hydrogenated nitrile rubber, silicone rubber, acrylic rubber and butyl rubber. Any of these rubbers have excellent heat resistance. Among these rubbers, the fluoro-rubber is most preferable because of its excellent properties including heat resistance and strength.

The hot-press cushioning member including such a fiber-rubber composite material layer may be an integrated laminate made of one or more fiber-rubber composite material layers and one or more layers of one or more materials selected from woven fabric, non-woven fabric, paper, a film, foil, a sheet and a board. It is needless to say that the hot-press cushioning member can be made of a single fiber-rubber composite material layer.

Another aspect of the present invention directs to a method for manufacturing a laminated plate. In the method, a hot-press cushioning member is interposed between an object to be compressed and a hot platen when the object, which is a stack of a plurality of laminated plate materials, is subjected to press forming by the application of heat and pressure. The hot-press cushioning member is characterized in that an amount of compressed thickness deformation (a) is obtained by subtracting a compressed thickness (H2) of the hot-press cushioning member under a predetermined press-forming pressure from an initial thickness (H1), an amount of restored thickness deformation (b) is obtained by subtracting the compressed thickness (H2) from an uncompressed thickness (H3) of the hot-press cushioning member with the press-forming pressure released, and the (a:b) ratio of the hot-press cushioning member ranges from 1:1 to 1:0.8.

Yet another aspect of the present invention directs to a method for manufacturing a plurality of laminated plates. In the method, a plurality of objects each made of a plurality of laminated plate materials stacked on each other are prepared, the objects are stacked on top of each other in layers and placed on a hot platen, and the objects are subjected to press forming by the application of heat and pressure with a hot-press cushioning member interposed between the object and the hot platen and/or between the objects. The hot-press cushioning member is characterized in that an amount of compressed thickness deformation (a) is obtained by subtracting a compressed thickness (H2) of the hot-press cushioning member under a predetermined press-forming pressure from an initial thickness (H1), an amount of restored thickness deformation (b) is obtained by subtracting the compressed thickness (H2) from an uncompressed thickness (H3) of the hot-press cushioning member with the press-forming pressure released, and the (a:b) ratio of the hot-press cushioning member ranges from 1:1 to 1:0.8.

According to the method for manufacturing a laminated plate of the invention, the hot-press cushioning member is compressed and deformed during the application of pressure by a press to uniformly pressurize the laminated plate. Even if the laminated plate is partially thinned due to fluidization of the resin or even if the thickness of each of the hot platen and delivered object changes due to curing contraction of resin and thermal contraction of the hot platen and delivered object, the cushioning member resiliently deforms itself so as to fit the changed thickness, thereby uniformly pressurizing across the entire face of the laminated plate. Thus, it is possible to provide a cushioning member capable of manufacturing a laminated plate having accurately controlled in-plane thickness and less residual strain and warpage and having excellent product quality even in areas where inner-layer circuits are not formed.

According to the method of the present invention, in which a plurality of objects stacked on top of each other in layers are pressed to manufacture laminated plates, simultaneous press-formation of the plurality of objects, each made of a plurality of laminated plate materials stacked on each other, can be more appropriately performed to manufacture laminated plates.

In the present invention, the cushioning member is placed in an optimal condition which varies depending on the kind of laminated plate, required quality, press accuracy, size, the thickness accuracy of the delivered object.

Consequently, according to the hot-press cushioning member and the method for manufacturing a laminated plate of the present invention, the ratio between the amount of compressed cushion and amount of restored cushion of the cushioning member is set within the aforementioned range, thereby applying uniform pressure on the object in the manufacture processes of the laminated plate. Even if the object is partially thinned due to fluidization of the resin or even if the thickness of each of the hot platen and delivered object changes due to curing contraction of the resin and thermal contraction of the hot platen and delivered object, the cushioning member resiliently deforms itself so as to fit the changed thickness, thereby uniformly pressurizing across the entire face of the laminated plate. Thus, it is possible to manufacture laminated plates having accurately controlled in-plane thickness and less residual strain and warpage and having excellent product quality even in areas where inner-layer circuits are not formed.

BEST MODES FOR CARRYING OUT THE INVENTION

Figure 1:
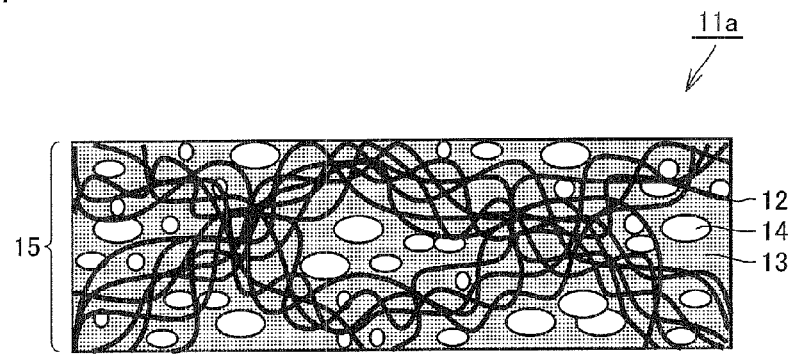
FIG. 1 is a schematic sectional view showing a part of a hot-press cushioning member according to an embodiment of the present invention.

With reference to the drawings, an embodiment of the present invention will be described below. FIG. 1 is a schematic sectional view partially showing a hot-press cushioning member according to an embodiment of the present invention. Referring to FIG. 1, the hot-press cushioning member (hereinafter, simply referred to as "cushioning member") 11a includes a fiber-rubber composite material layer 15 made of bulked yarn 12 as woven fabric and fluoro-rubber 13 impregnated in the bulked yarn 12 and containing interstices 14. In this embodiment, the woven fabric made of the bulked yarn 12A is a web. The cushioning member 11a is configured so that the ratio between an amount of compressed cushion and amount of restored cushion ranges from 1:1 to 1:0.8.

Figure 2:
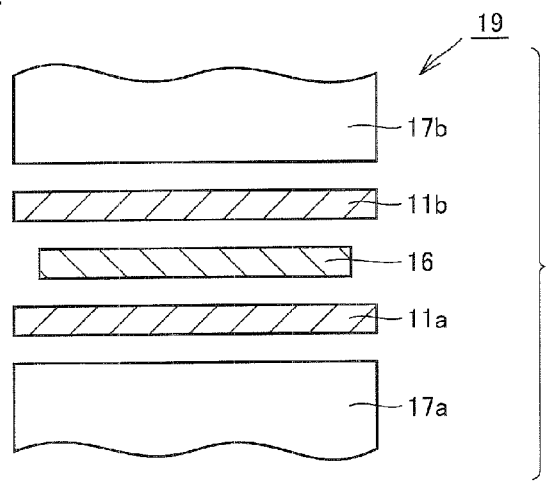
FIG. 2 is a schematic sectional view of a press used for manufacturing laminated plates.

FIG. 2 is a schematic sectional view showing a press used to manufacture laminated plates. Referring to FIG. 2, the press 19 has two hot platens 17a, 17b facing each other vertically. A description will be made about a method for manufacturing a laminated plate according to the embodiment of the present invention. First, a plurality of laminated plate materials is stacked on each other to prepare an object 16 which will be compressed. Next, the object 16 is sandwiched between two identical cushioning members 11a and 11b, and then placed between the vertically arranged hot platens 17a and 17b. Specifically, each of the cushioning members 11a, 11b is disposed between the object 16 and hot platens 17a, 17b. Then, the hot platens 17a, 17b apply heat and pressure to the object 16 to perform press-forming. In this manner, a laminated plate is produced.

Figure 3:
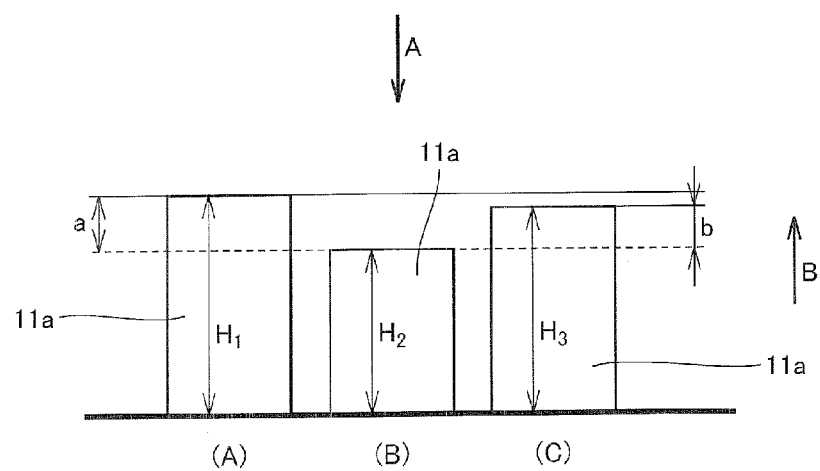
FIG. 3 illustrates the relationship between an amount of compressed cushion and amount of restored cushion of the cushioning member.

A description will be made about an amount of compressed cushion and amount of restored cushion of the cushioning member 11a. FIG. 3 illustrates the relationship between the amount of compressed cushion and amount of restored cushion of the cushioning member 11a. Referring to FIG. 3, the thickness of an unused cushioning member 11a in an initial state, more specifically, in a state where it is not applied with pressure (FIG. 3(A)) is defined as H1. The cushioning member 11a is compressed by application of pressure (FIG. 3(B)). The thickness of the cushioning member 11a that is applied with a predetermined pressure for press-forming in the direction of arrow A in FIG. 3 is defined as a compressed thickness H2. An amount of compressed thickness deformation, or amount of compressed cushion, of the cushioning member 11a is obtained by subtracting the compressed thickness H2 of the cushioning member 11a under the predetermined press-forming pressure from the thickness H1 of the initial cushioning member 11a. In other words, the amount of compressed cushion a is expressed by H1-H2.

When the predetermined press-forming pressure is released, the cushioning member 11a springs back in the direction of arrow B (FIG. 3(C)) to return to its original shape. The thickness of the depressurized cushioning member 11a is defined as an uncompressed thickness H3. An amount of restored thickness deformation, or an amount of restored cushion, of the cushioning member 11a is obtained by subtracting the thickness H2 of the cushioning member 11a under the predetermined press-forming pressure from the thickness H3 of the cushioning member 11a released from the predetermined press-forming pressure. In other words, the amount of restored cushion b is expressed by H3-H2. The ratio between the amount of compressed cushion and amount of restored cushion is represented by a:b in this description. Note that restoration ratios appearing in the following tables and graphs are values of b/a expressed in percentage.

Figure 4:
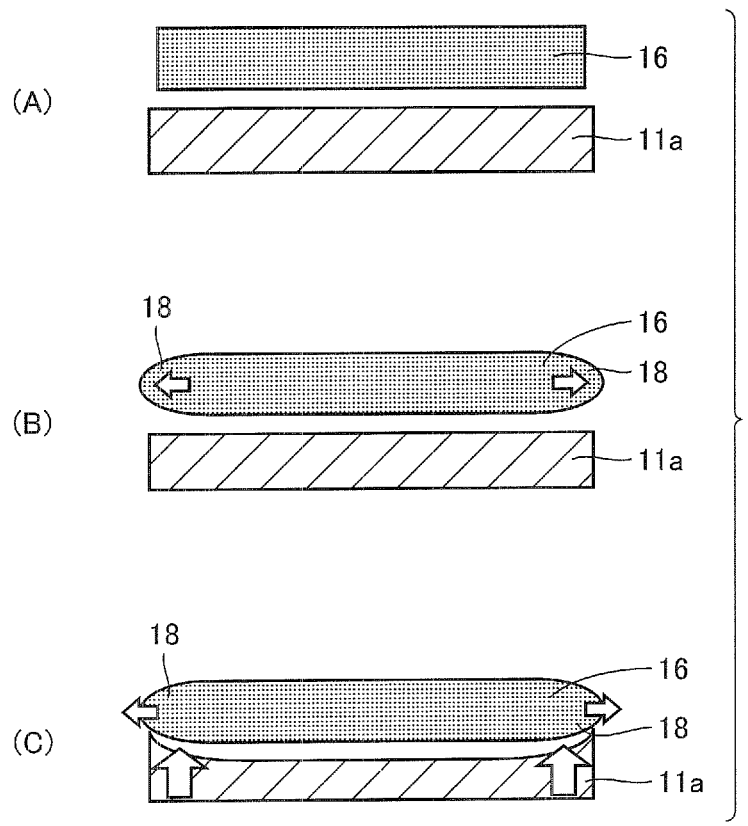
FIG. 4 is a diagram showing a mechanism in the manufacturing method of a laminated plate according to the present invention.
Figure 16:
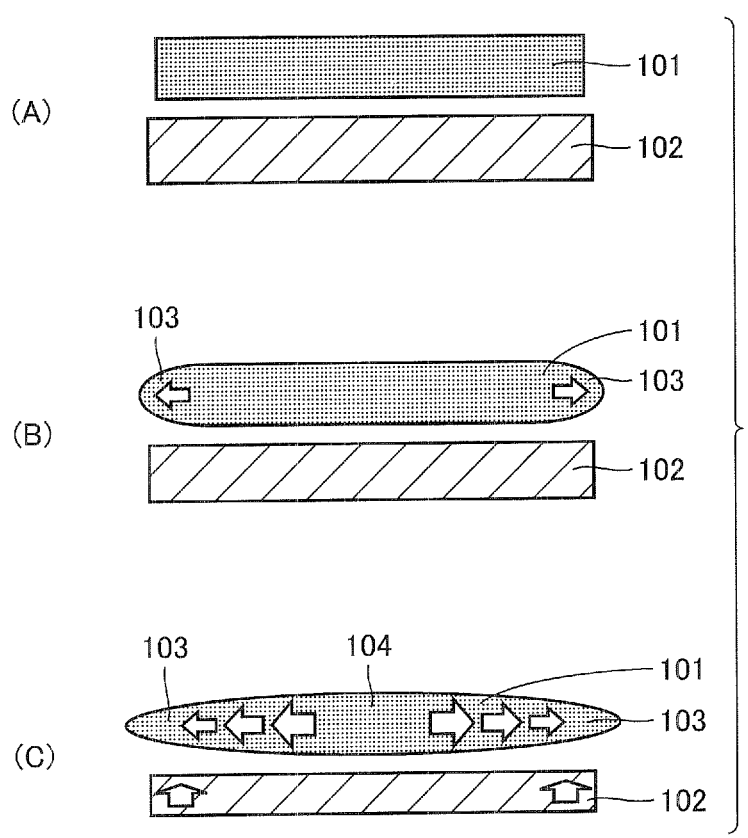
FIG. 16 is a diagram showing a mechanism of a conventional method for manufacturing laminated plates.

Next, a mechanism of the manufacturing method of the laminated plate according to the present invention will be described. FIG. 4 is a diagram showing the mechanism of the manufacturing method of the laminated plate according to the invention and also corresponds to FIG. 16. Referring to FIGS. 1 to 4, the object 16 is pressurized flat and uniformly by the cushioning member 11a (FIG. 4(A)). With fluidization of the resin (FIG. 4(B)), the resin in the end part 18 of the object 16 starts flowing outwardly, that is, in the direction indicated by outlined rightward and leftward arrows in FIG. 4(B). Because the cushioning member is the above-described cushioning member 11a configured to have the ratio between the amount of compressed cushion and amount of restored cushion ranging from 1:1 to 1:0.8, the cushioning member 11a exhibits sufficient resilience even at an end part corresponding to the thin end part 18 of the object 16 as shown by outlined vertical arrows, thereby pressurizing uniformly the plane (FIG. 4(C)). This prevents the resin from flowing from inside to outside. The manufacturing method is deemed to be established based on such a mechanism.

EXAMPLES

The following are examples of the present invention. Like materials are denoted by like reference numbers.

Example 1

Figure 5:
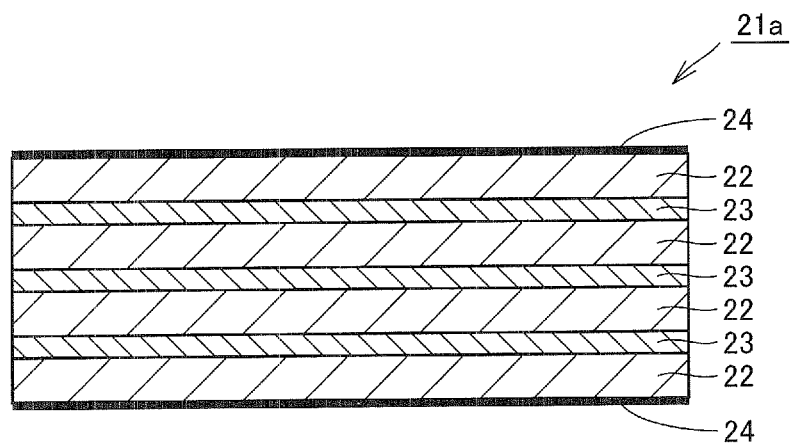
FIG. 5 illustrates a structure of a cushioning member according to Example 1.

A cushioning member 21a shown in FIG. 5 is used as the hot-press cushioning member. Referring to FIG. 5, the cushioning member 21a is made of four fiber-rubber composite material layers 22 adhered with adhesive layers 23 and surface layers 24 placed around outer faces of the adhered layers 22 and 23 to make the stacked layers into one piece. The fiber-rubber composite material layer 22 is fluoro-rubber impregnated glass woven fabric "T860" (made by UNITIKA LTD.) made of bulked yarn. The surface layer 24 is provided mainly to impart releasability to the hot-press cushioning member. The base material of the surface layer 24 is woven fabric having a back surface applied with fluoro-rubber base adhesive and a front surface applied with polyimide resin. The adhesive layer 23 includes woven fabric, as a base material, with fluoro-rubber base adhesive applied on both surfaces. The initial thickness of the cushioning member 21a is 4.04 mm.

Example 2

Figure 6:
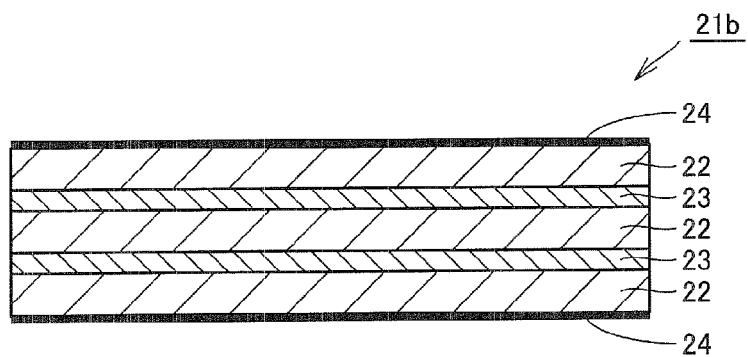
FIG. 6 illustrates a structure of a cushioning member according to Example 2.

A cushioning member 21b shown in FIG. 6 is used as the hot-press cushioning member. Referring to FIG. 6, the cushioning member 21b is made of three fiber-rubber composite material layers 22 adhered with adhesive layers 23 and surface layers 24 placed around outer faces of the adhered layers 22 and 23 to make the stacked layers into one piece. The initial thickness of the cushioning member 21b is 3.10 mm.

Example 3

Figure 7:
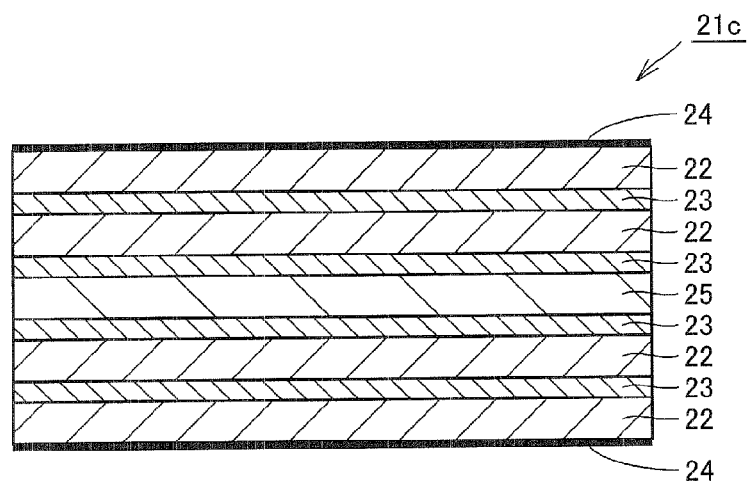
FIG. 7 illustrates a structure of a cushioning member according to Example 3.

A cushioning member 21c shown in FIG. 7 is used as the hot-press cushioning member. Referring to FIG. 7, the cushioning member 21c is made of four fiber-rubber composite material layers 22 each having a fluorine-coated surface and a fluoro-rubber layer 25 placed in the middle of the cushioning member, those of which are adhered with adhesive layers 23, and surface layers 24 placed around outer faces of the adhered layers 22, 25 and 23 to make the stacked layers into one piece. The initial thickness of the cushioning member 21c is 3.55 mm.

Example 4

Figure 8:
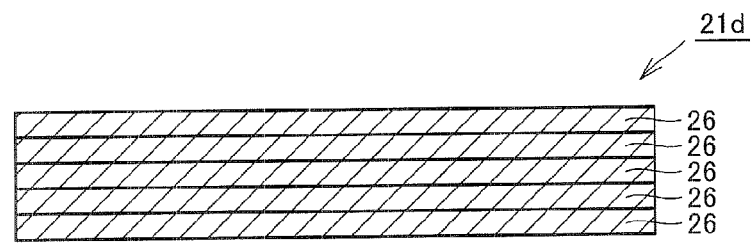
FIG. 8 illustrates a structure of a cushioning member according to Example 4.

A cushioning member 21d shown in FIG. 8 is used as the hot-press cushioning member. Referring to FIG. 8, the cushioning member 21d is made of five fiber-rubber composite material layers 26 adhered to each other. The fiber-rubber composite material layer 26 used in this example is made of glass paper "Grabestos" (manufactured by Oribest Co. Ltd.), which is E glass fiber (fiber diameter: 9 μm, fiber length: 13 mm) shaped into a sheet by a wet paper-making method, and fluoro-rubber impregnated in the glass paper. The initial thickness of the cushioning member 21d is 3.20 mm.

Example 5

A fiber-rubber composite material with interstices accounting for 77% of the composite is used as the hot-press cushioning member. For making the fiber-rubber composite material, non-woven fabric (450 g/m2), which is made of aromatic polyamide fiber "Conex" (manufactured by TEIJIN LIMITED) intertwined by a needle punching method, is impregnated with dissolved fluoro-rubber (500 g/m2) and dried. The initial thickness of the cushioning member is 2.55 mm.

Comparative Example 1

Eight sheets of kraft paper (190 g/m2) are used as the hot-press cushioning member. The initial thickness of the cushioning member is 2.51 mm.

Comparative Example 2

Figure 9:
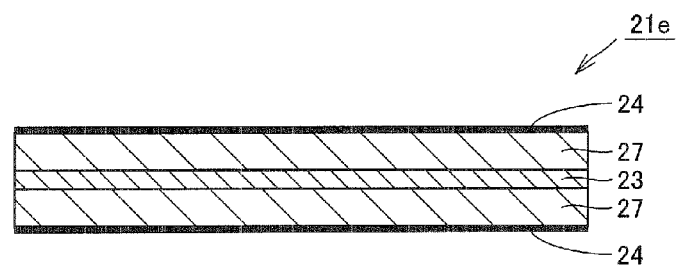
FIG. 9 illustrates a structure of a cushioning member according to Comparative example 2.

A cushioning member shown in FIG. 9, i.e., "TOP BOARD SE20FGK" (manufactured by Yamauchi Corp.) 21e is used as the hot-press cushioning member. Referring to FIG. 9, the cushioning member 21e is made of two layers of aromatic polyamide non-woven fabric (450 g/m2) 27 adhered with an adhesive layer 23 and surface layers 24 placed around outer faces of the adhered layers 27 and 23 to make the stacked layers into one piece. The initial thickness of the cushioning member 21e is 2.4 mm.

Comparative Example 3

Figure 10:
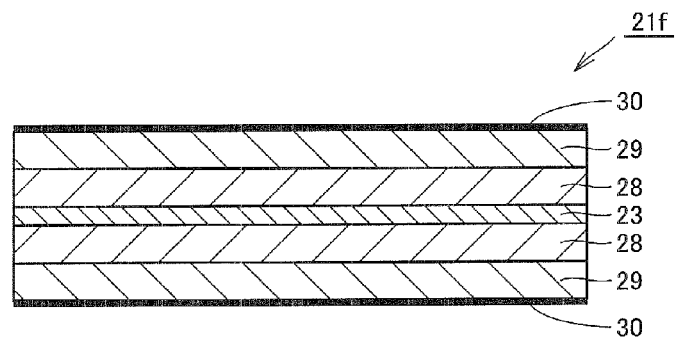
FIG. 10 illustrates a structure of a cushioning member according to Comparative example 3.

A cushioning member shown in FIG. 10, i.e., "TOP BOARD K2-20MK" (manufactured by Yamauchi Corp.) 21f is used as the hot-press cushioning member. Referring to FIG. 10, the cushioning member 21f is made of two fluoro-rubber layers (thickness: 0.5 mm) 28 adhered with an adhesive layer 23, two layers of aromatic polyamide non-woven fabric (650 g/m2) 29 sandwiching the adhered layers 28 and 23, and surface layers 30 of aromatic polyamide cloth placed around outer faces of the adhered layers 28, 23 and 29 to make the stacked layers into one piece. The initial thickness of the cushioning member 21f is 4.4 mm.

Figure 11:
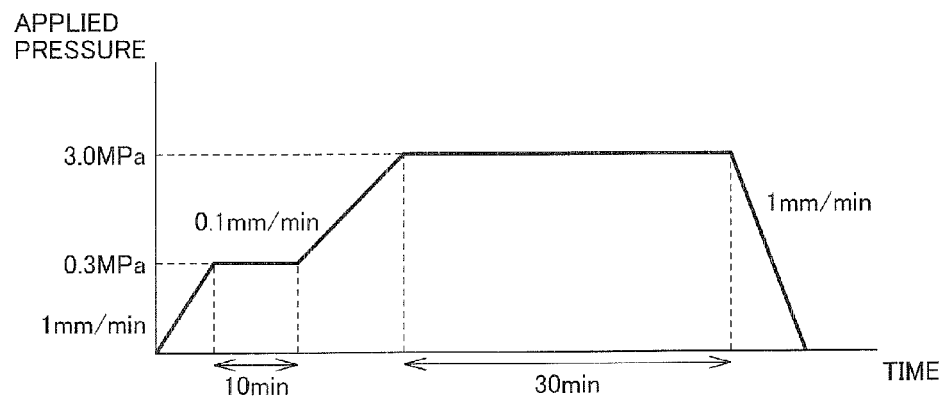
FIG. 11 illustrates a press cycle in which an amount of compressed cushion and an amount of restored cushion are measured.

For the purpose of evaluation, each sample was pressed in a cycle shown by FIG. 11 to measure its properties. Before the samples undergo a pressing process (zero time), all of the samples were subjected to the property measurement. Then, measurements for Examples 1 to 3 and 5 and Comparative examples 2 and 3 were taken after they were pressed 200 times and for Example 4 after it was pressed 100 times. As to Comparative example 1, only the unused one's properties were measured.

The amount of cushion, i.e., the amount of compressed cushion and amount of restored cushion were measured in the cycle shown by FIG. 11. In FIG. 11, the vertical axis denotes pressure (MPa) applied by a press, while the horizontal axis denotes time (min). In the pressing cycle, the applied pressure was increased from 0 MPa to 0.3 MPa at a compression rate of 1 mm/min, was maintained at 0.3 MPa for ten minutes, was increased from 0.3 MPa to 3.0 MPa at a compression rate of 0.1 mm/min, was maintained at 3.0 MPa for thirty minutes, and then was decreased from 3.0 MPa to 0 MPa at a decompression rate of 1 mm/min. The heating temperature was constantly maintained at 210° C. The amount of compressed cushion is an amount of thickness deformation obtained by subtracting a compressed thickness H2 of the cushioning member immediately before it is released from the pressure of 3.0 MPa from the initial thickness H1, and therefore is expressed by H1-H2. The amount of restored cushion is an amount of thickness deformation obtained by subtracting the compressed thickness H2 of the cushioning member immediately before it is released from the pressure of 3.0 MPa from an uncompressed thickness H3 of the cushioning member depressurized to 0 MPa, and therefore is expressed by H3-H2.

Figure 12:
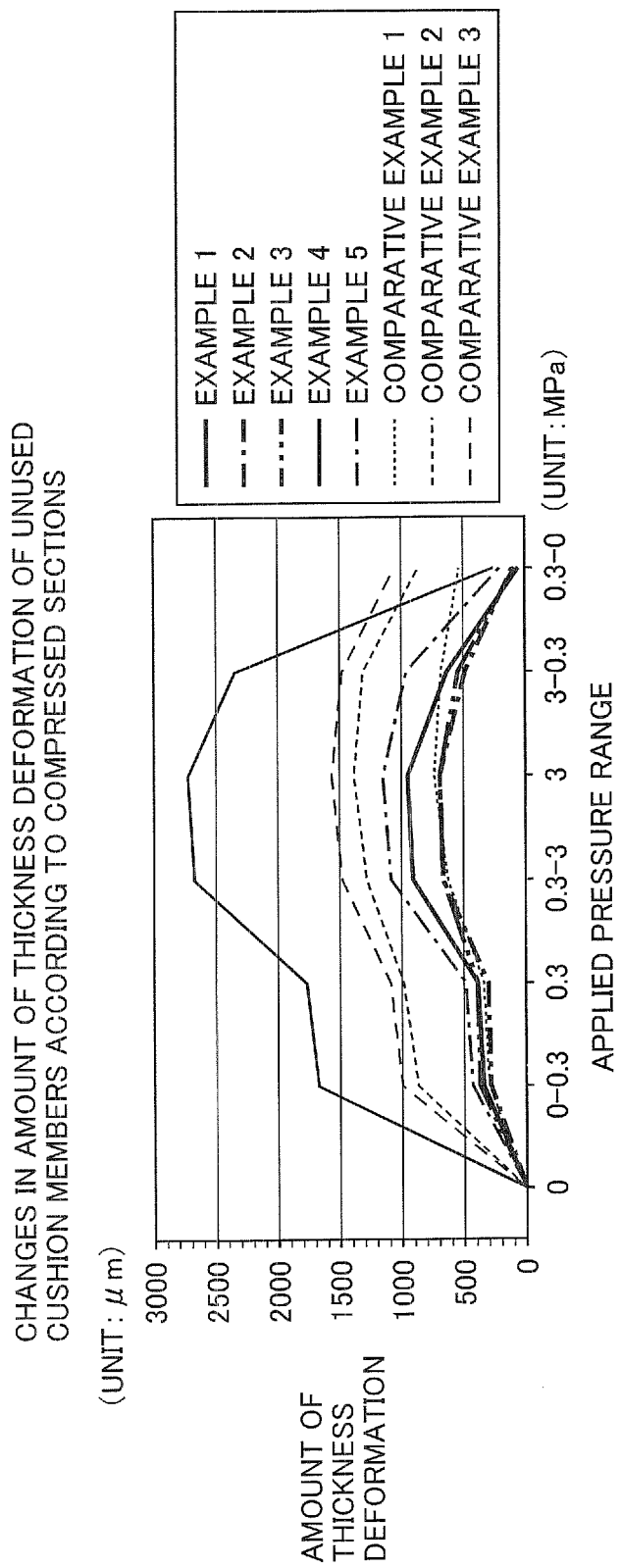
FIG. 12 is a graph showing changes in the amount of thickness deformation of unused cushioning members.
Figure 13:
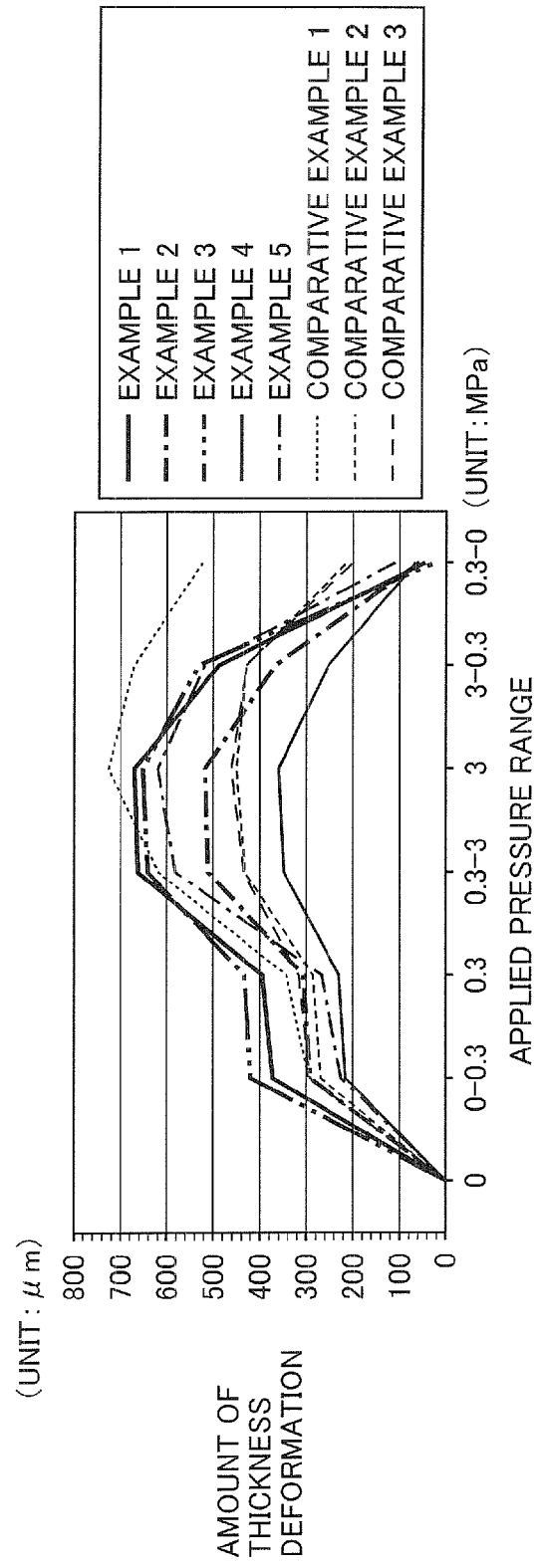
FIG. 13 is a graph showing changes in the amount of thickness deformation of cushioning members deteriorated due to pressing.
Figure 14:
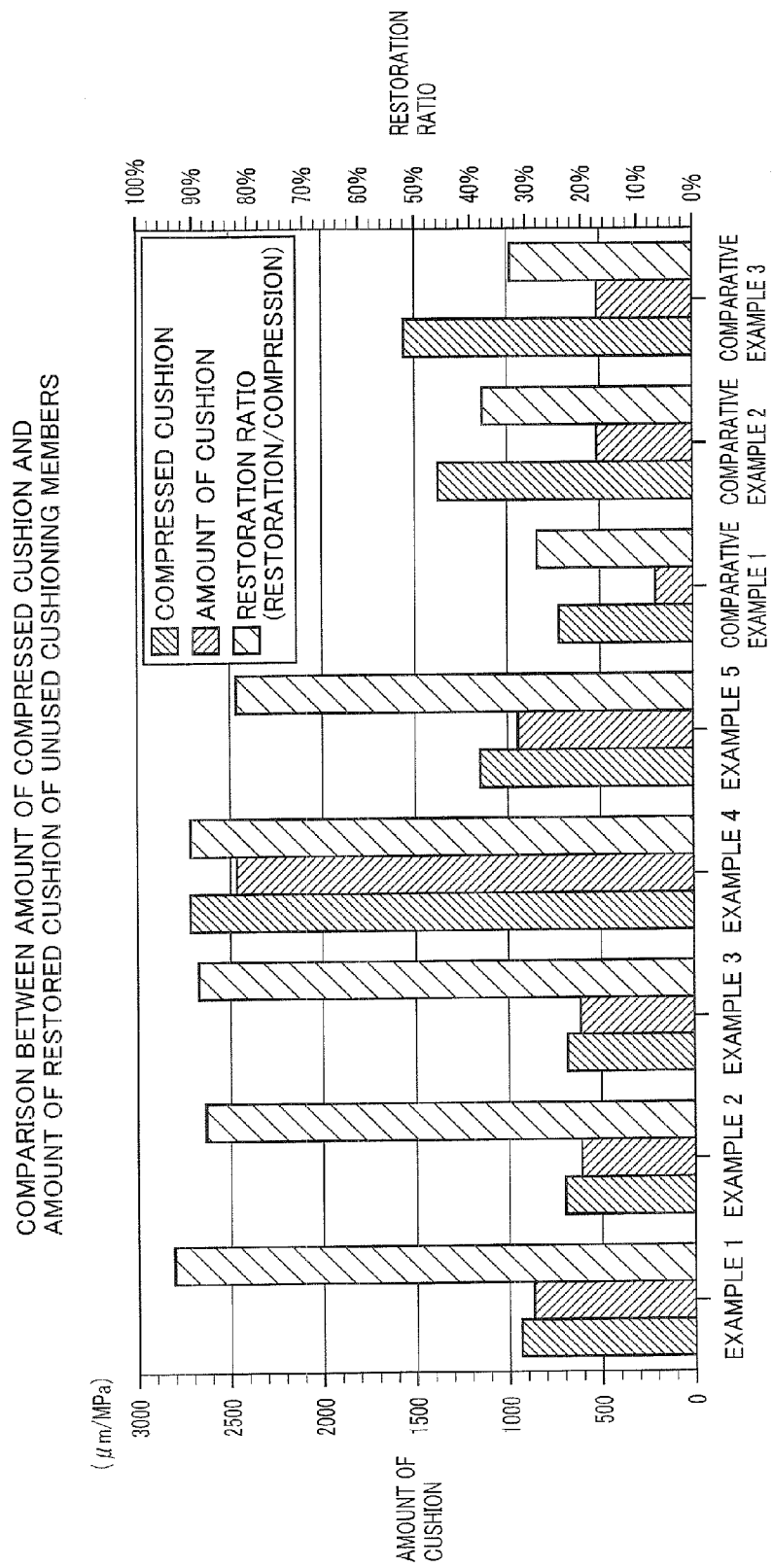
FIG. 14 is a graph to compare the amount of compressed cushion and amount of restored cushion of unused cushioning members.
Figure 15:
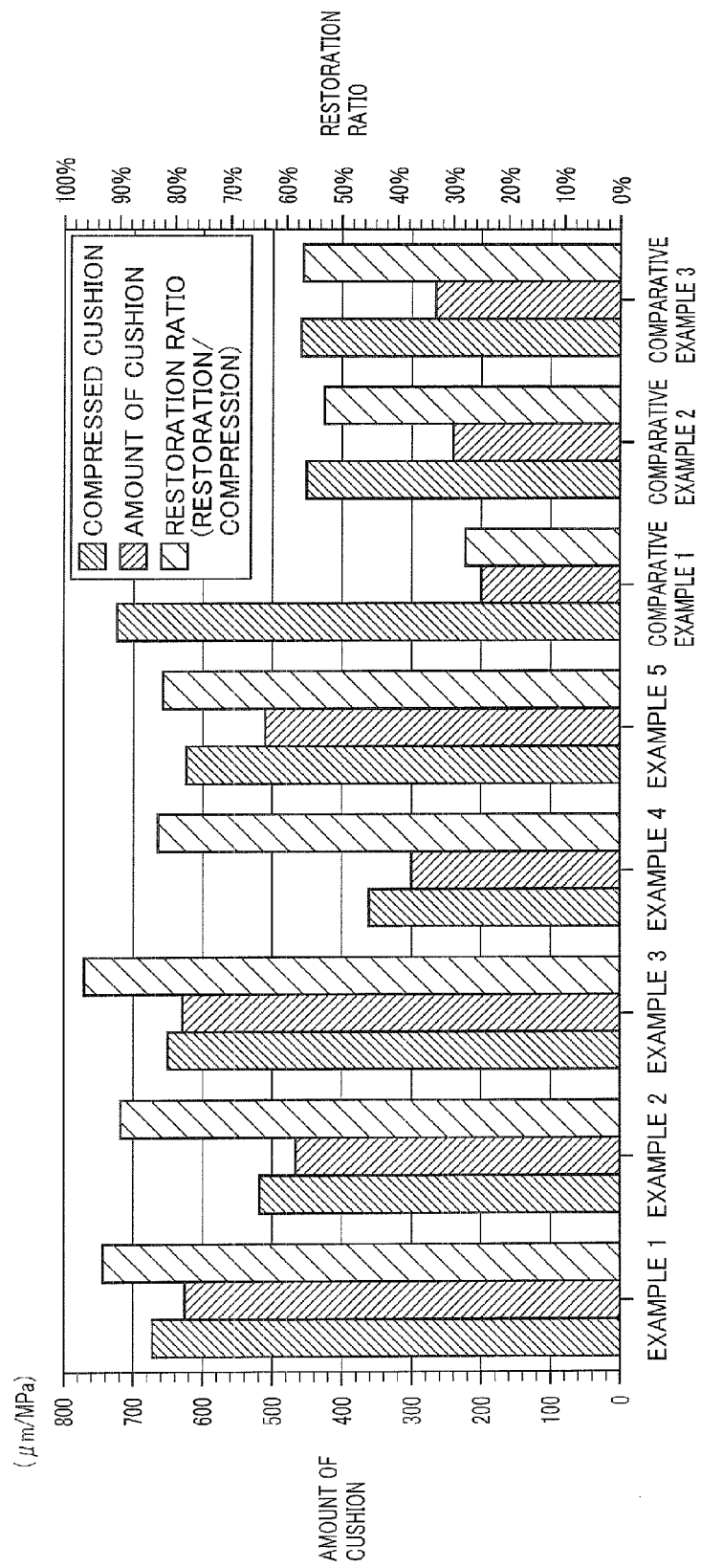
FIG. 15 is a graph to compare the amount of compressed cushion and amount of restored cushion of cushioning members pressed at a predetermined number of times.

Measurement results are shown in FIGS. 12, 13, 14 and 15, and Tables 1 and 2. FIG. 12 is a graph showing changes in the amount of thickness deformation of the unused cushioning members according to compressed sections, and has a vertical axis representing the thickness deformation and a horizontal axis representing applied pressure ranges. FIG. 13 is a graph showing changes in the amount of thickness deformation of the cushioning member after being pressed at a predetermined number of times according to compressed sections and has vertical and horizontal axes representing the same as those in FIG. 12, respectively. In FIG. 13, data of Comparative example 1 is obtained from an unused sample thereof. FIG. 14 is a graph to compare the amount of compressed cushion, amount of restored cushion and restoration ratio as to every unused sample, and has a vertical axis representing the amount of cushion and restoration ratio and a horizontal axis representing the samples. FIG. 15 is a graph to compare the amount of compressed cushion, amount of restored cushion and restoration ratio as to every sample pressed at a predetermined number of times, and has vertical and horizontal axes representing the same as those in FIG. 14, respectively. The unit is indicated in the drawings. The data of the graphs in FIGS. 12 to 15 is detailed in Tables 1 and 2.

[Table 1]

[Table 2]

As shown above, the cushioning members of Examples 1 to 5 have a ratio between the amount of compressed cushion and amount of restored cushion ranging from 1:1 to 1:0.8. On the other hand, with respect to the amount of compressed cushion expressed as 1 part, the amounts of restored cushion of all Comparative examples 1 to 3 are much lower than 0.8 parts.

In addition, a formation test was conducted with the above-described samples according to the following procedure. First, four prepregs, each of which is 0.1 mm in thickness and made of a glass cloth impregnated with a thermosetting epoxy resin in B-stage (partially cured), are stacked. Then, release films are placed on both sides of the prepregs and metal plates sandwich the prepregs with the release films. After being placed between hot platens, the prepregs are heated at a temperature of 180° C. and pressed at a pressure of 4 MPa for two hours and cooled under the same pressure to produce a laminated plate. During the procedure, an aluminum spacer of 0.2 mm in thickness with a hole of 30 mm in diameter is placed between one of the hot platens and a hot-press cushioning member for the purpose of checking how concavity and convexity influence the laminated plate. The results are shown in Table 3.

[Table 3]

Each evaluation item was determined based on the following criteria.

Thickness accuracy of formed products:

Measurement of thickness was performed at eight positions of formed products including four positions around corner edges and four positions in the middle part to check thickness variations. The measurement was not performed around the hole of the aluminum spacer. If (maximum value−minimum value)/average×100 is equal to or less than 10%, the sample is evaluated as "◯", whereas if it is greater than 10%, the sample is evaluated as "Δ".

Thickness Condition:

The same manner as the measurement of the thickness accuracy of the formed products was used. If the difference in thickness between a corner edge and a middle area is equal to or less than 10% of the average of the thicknesses and if asperities are not found in a graph plotted with the thicknesses of the formed product's profile, the sample is evaluated as "flat", whereas if asperities are found, the shape of the sample is indicated.

Strain and Warpage of Formed Products:

If a formed product on a flat surface plate has no area off the plate and if drilling in the formed product does not produce cracks around the drilled hole, the sample is evaluated as "◯", whereas if cracks open, the sample is evaluated as "Δ".

Condition of Concaved Area:

If the area of the formed product corresponding to the hole of the aluminum spacer has no irregular appearance, such as thin spots and voids, the sample is evaluated as "◯", whereas if irregularities are found, the sample is evaluated as "Δ".

As described above, an FRR having the aforementioned structure, that is, in which fiber, rubber and interstices are integrated and the ratio between the amount of compressed cushion and amount of restored cushion is in the aforementioned range enables manufacture of laminated plates having accurately controlled in-plane thickness without strains and warpage and having excellent quality in concaved areas.

The foregoing has described the embodiment of the present invention by referring to the drawings. However, the invention should not be limited to the illustrated embodiment. It should be appreciated that various modifications and changes can be made to the illustrated embodiment within the scope of the appended claims and their equivalents.

INDUSTRIAL APPLICABILITY

The hot-press cushioning member and method for manufacturing laminated plates according to the present invention are effective for manufacturing laminated plates requiring high thickness accuracy and quality and for meeting a demand for long-life cushioning member.

TABLE 1

| Number of presses | unit | Example 1 | | Example 2 | | Example 3 | | Example 4 | | Example 5 | |
|---|---|---|---|---|---|---|---|---|---|---|---|
| | times | 0 | 200 | 0 | 200 | 0 | 200 | 0 | 100 | 0 | 200 |
| deformation amount when pressure is increased from 0 to 0.3 MPa | μm | 318 | 374 | 270 | 291 | 378 | 421 | 1673 | 219 | 424 | 224 |
| deformation amount when pressure is maintained at 0.3 MPa | μm | 33 | 18 | 24 | 13 | 13 | 9 | 89 | 10 | 52 | 38 |
| deformation amount when pressure is increased from 0.3 to 3.0 MPa | μm | 561 | 269 | 378 | 208 | 263 | 212 | 913 | 122 | 605 | 320 |
| deformation amount when pressure is maintained at 3.0 MPa | μm | 28 | 9 | 20 | 6 | 26 | 10 | 45 | 9 | 64 | 41 |
| compressed cushion amount (0 to 3.0 MPa) | μm | 940 | 670 | 692 | 518 | 680 | 652 | 2720 | 360 | 1145 | 623 |
| compressed cushion amount | μm/MPa | 313 | 223 | 231 | 173 | 227 | 217 | 907 | 120 | 382 | 208 |
| deformation amount when pressure is decreased from 3 to 0.3 MPa | μm | 306 | 175 | 202 | 152 | 140 | 122 | 369 | 107 | 191 | 103 |
| deformation amount when pressure is decreased from 0.3 to 0 MPa | μm | 575 | 450 | 407 | 313 | 466 | 506 | 2102 | 193 | 752 | 410 |
| restored cushion amount (3.0 to 0 MPa) | μm | 881 | 625 | 609 | 465 | 606 | 628 | 2471 | 300 | 943 | 533 |
| restored cushion amount | μm/MPa | 294 | 208 | 203 | 155 | 202 | 209 | 824 | 100 | 314 | 178 |
| restoration ratio (restoration/compression) | % | 93.72% | 93.28% | 88.01% | 89.77% | 89.12% | 96.32% | 90.85% | 83.33% | 82.36% | 85.55% |
| (compressed cushion amount: restored cushion amount) | | 1:0.9372 | 1:0.9328 | 1:0.8801 | 1:0.8977 | 1:0.8912 | 1:0.9632 | 1:0.9085 | 1:0.8333 | 1:0.8236 | 1:0.8555 |

TABLE 2

| Number of presses | unit | comparative example 1 | comparative example 2 | | comparative example 3 | |
|---|---|---|---|---|---|---|
| | times | 0 | 0 | 200 | 0 | 200 |
| deformation amount when pressure is increased from 0 to 0.3 MPa | μm | 292 | 864 | 270 | 998 | 294 |
| deformation amount when pressure is maintained at 0.3 MPa | μm | 48 | 117 | 16 | 87 | 23 |
| deformation amount when pressure is increased from 0.3 to 3.0 MPa | μm | 279 | 307 | 147 | 393 | 121 |
| deformation amount when pressure is maintained at 3.0 MPa | μm | 106 | 87 | 17 | 86 | 24 |
| compressed cushion amount (0 to 3.0 MPa) | μm | 725 | 1375 | 450 | 1564 | 462 |
| compressed cushion amount (0 to 3.0 MPa) | μm/MPa | 242 | 458 | 150 | 521 | 154 |
| deformation amount when pressure is decreased from 3 to 0.3 MPa | μm | 54 | 62 | 22 | 92 | 35 |
| deformation amount when pressure is decreased from 0.3 to 0 MPa | μm | 148 | 458 | 217 | 423 | 229 |
| restored cushion amount (3.0 to 0 MPa) | μm | 202 | 520 | 239 | 515 | 264 |
| restored cushion amount | μm/MPa | 67 | 173 | 80 | 172 | 88 |
| restoration ratio (restoration/compression) | % | 27.86% | 37.82% | 53.11% | 32.93% | 57.14% |
| (compressed cushion amount: restored cushion amount) | | 1:0.2786 | 1:0.3782 | 1:0.5311 | 1:0.3293 | 1:0.5714 |

TABLE 3

|  | Example 1 | Example 2 | Example 3 | Example 4 | Example 5 | Comparative example 1 | Comparative example 2 | Comparative example 3 |
|---|---|---|---|---|---|---|---|---|
| thickness accuracy of formed product | ○ | ○ | ○ | ○ | ○ | ○ | Δ | Δ |
| thickness condition | flat | flat | flat | flat | flat | convex | convex | convex |
| strain and warpage of formed product | ○ | ○ | ○ | ○ | ○ | Δ | Δ | ○ |
| condition of concaved area | ○ | ○ | ○ | ○ | ○ | Δ | Δ | Δ |

The invention claimed is:

1. A hot-press cushioning member used between an object to be compressed and a hot platen when the object, which is a stack of a plurality of laminated plate materials, is subjected to press forming by the application of heat and pressure to manufacture a laminated plate, said hot-press cushioning member comprising:
   a fiber-rubber composite material layer made of a web and rubber impregnated in said web, wherein
   said fiber-rubber composite material layer contains voids, an amount of compressed thickness deformation (a) is obtained by subtracting a compressed thickness (H2) of the hot-press cushioning member under a predetermined press-forming pressure from an initial thickness (H1), an amount of restored thickness deformation (b) is obtained by subtracting said compressed thickness (H2) from an uncompressed thickness (H3) of the hot-press cushioning member with said press-forming pressure released, and the (a:b) ratio ranges from 1:1 to 1:0.8 and
   said web is woven fabric made of texturized yarn.

2. A method for manufacturing a laminated plate by subjecting an object to press forming by the application of heat and pressure with a hot-press cushioning member interposed between said object and a hot platen, said object being a stack of a plurality of laminated plate materials, wherein
   said hot-press cushioning member comprises a fiber-rubber composite material layer made of a web and rubber impregnated in said web,
   said fiber-rubber composite material layer contains voids, said hot-press cushioning member is configured so that an amount of compressed thickness deformation (a) is obtained by subtracting a compressed thickness (H2) of the hot-press cushioning member under a predetermined press-forming pressure from an initial thickness (H1), an amount of restored thickness deformation (b) is obtained by subtracting said compressed thickness (H2) from an uncompressed thickness (H3) of the hot-press cushioning member with said press-forming pressure released, and the (a:b) ratio ranges from 1:1 to 1:0.8, and
   said web is woven fabric made of texturized yarn.

3. A method for manufacturing a plurality of laminated plates by subjecting a plurality of objects to press forming by the application of heat and pressure with a hot-press cushioning member interposed between said objects and a hot platen, each of said plurality of objects being a stack of a plurality of laminated plate materials, said plurality of objects being stacked on top of each other in layers and placed on said hot platen, wherein
   said hot-press cushioning member comprises a fiber-rubber composite material layer made of a web and rubber impregnated in said web,
   said fiber-rubber composite material layer contains voids, said hot-press cushioning member is configured so that an amount of compressed thickness deformation (a) is obtained by subtracting a compressed thickness (H2) of the hot-press cushioning member under a predetermined press-forming pressure from an initial thickness (H1), an amount of restored thickness deformation (b) is obtained by subtracting said compressed thickness (H2) from an uncompressed thickness (H3) of the hot-press cushioning member with said press-forming pressure released, and the (a:b) ratio ranges from 1:1 to 1:0.8, and
   said web is woven fabric made of texturized yarn.

* * * * *